United States Patent [19]

Okano et al.

[11] Patent Number: 5,018,763
[45] Date of Patent: May 28, 1991

[54] SYSTEM FOR VEHICLE SAFETY DEVICES

[75] Inventors: Masami Okano; Kunihiro Takeuchi, both of Higashimatsuyama, Japan

[73] Assignee: Zexel Corporation, Japan

[21] Appl. No.: 552,706

[22] Filed: Jul. 16, 1990

[30] Foreign Application Priority Data

Jul. 21, 1989 [JP] Japan ................. 1-189879

[51] Int. Cl.$^5$ ............................................. B60R 21/16
[52] U.S. Cl. .................................... 280/735; 180/271; 340/438; 307/10.1
[58] Field of Search ....................... 280/728, 734, 735; 180/268, 271, 282; 340/436, 438; 307/10.1

[56] References Cited

U.S. PATENT DOCUMENTS

| | | | |
|---|---|---|---|
| 3,818,431 | 6/1974 | Hosaka | 340/436 |
| 4,222,030 | 9/1980 | Yasui et al. | 280/735 |
| 4,845,377 | 7/1989 | Swart | 307/10.1 |
| 4,873,452 | 10/1989 | Morota et al. | 280/734 |
| 4,887,843 | 12/1989 | Husby | 280/735 |

FOREIGN PATENT DOCUMENTS

| | | | |
|---|---|---|---|
| 2406256 | 8/1974 | Fed. Rep. of Germany | 280/735 |
| 61-241231 | 10/1986 | Japan . | |
| 63-166636 | 7/1988 | Japan . | |

*Primary Examiner*—Charles A. Marmor
*Assistant Examiner*—Tamara L. Finlay
*Attorney, Agent, or Firm*—Pollock, Vande Sande & Priddy

[57] ABSTRACT

In a vehicle safety system having a warning buzzer an inductance element of the buzzer is also used as a coil element for stepping up voltage in a voltage step-up circuit of an energy reservoir in which the electric energy required for actuating an electrically fired actuator of a safety device is stored in a capacitor of large capacity. The voltage step-up circuit is adapted to produce a high output voltage in response to the application of an appropriate ON/OFF signal. In the case where it is detected that an abnormal condition has arisen in the system, a signal having an audible frequency component is applied to the voltage step-up circuit, whereby the buzzer operates to generate a warning sound.

9 Claims, 2 Drawing Sheets

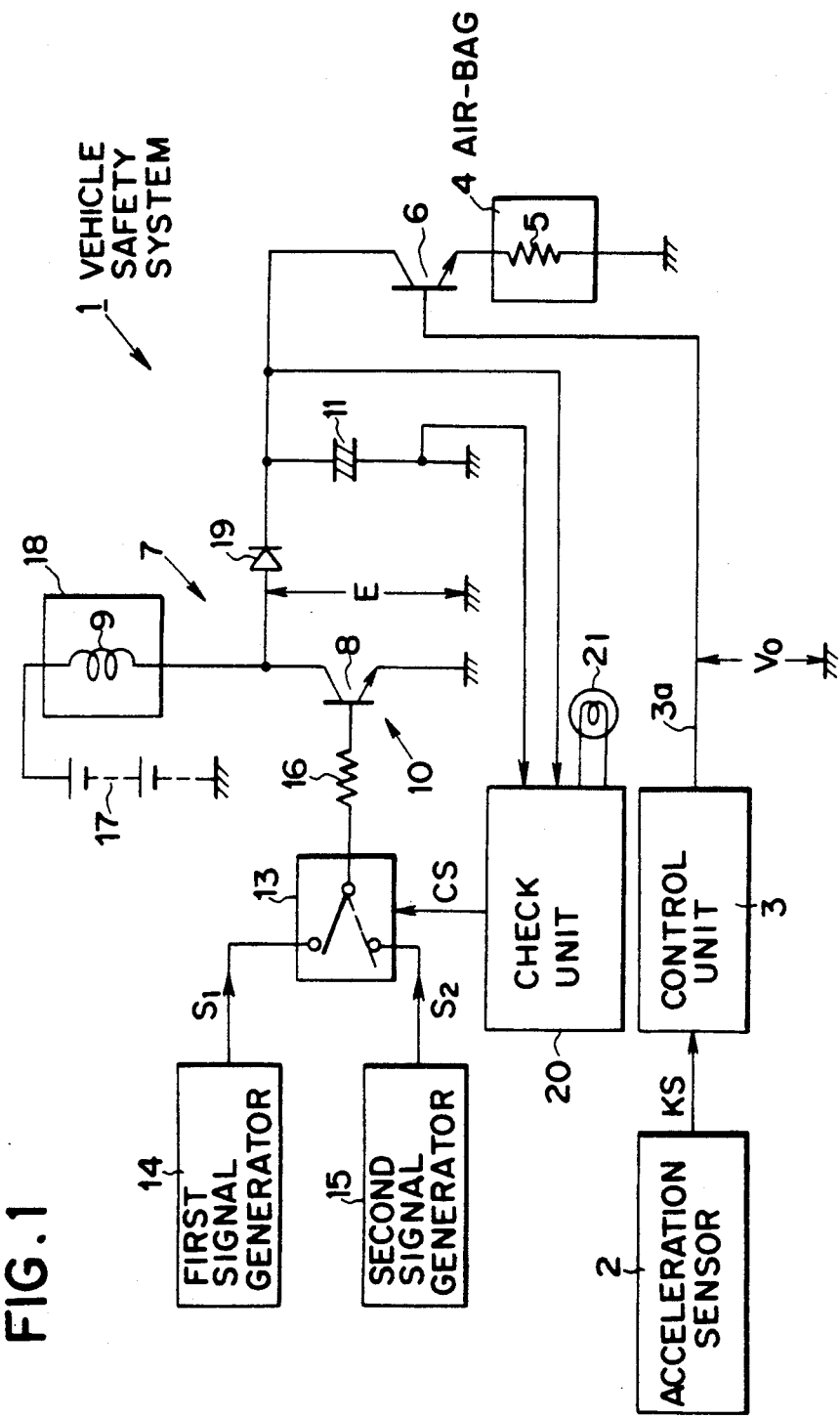

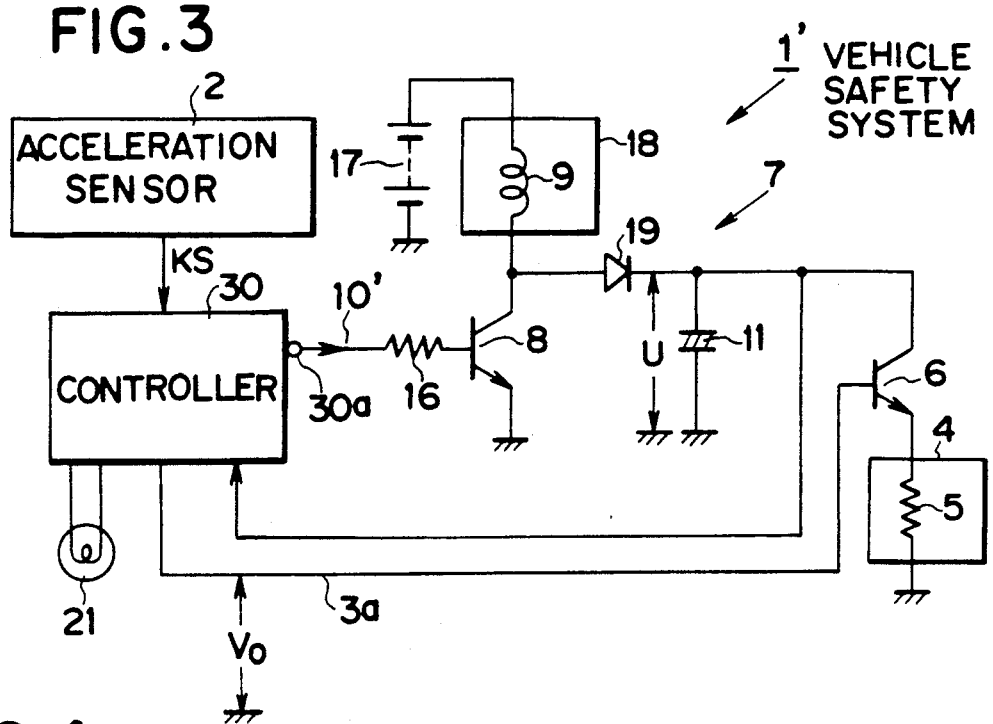
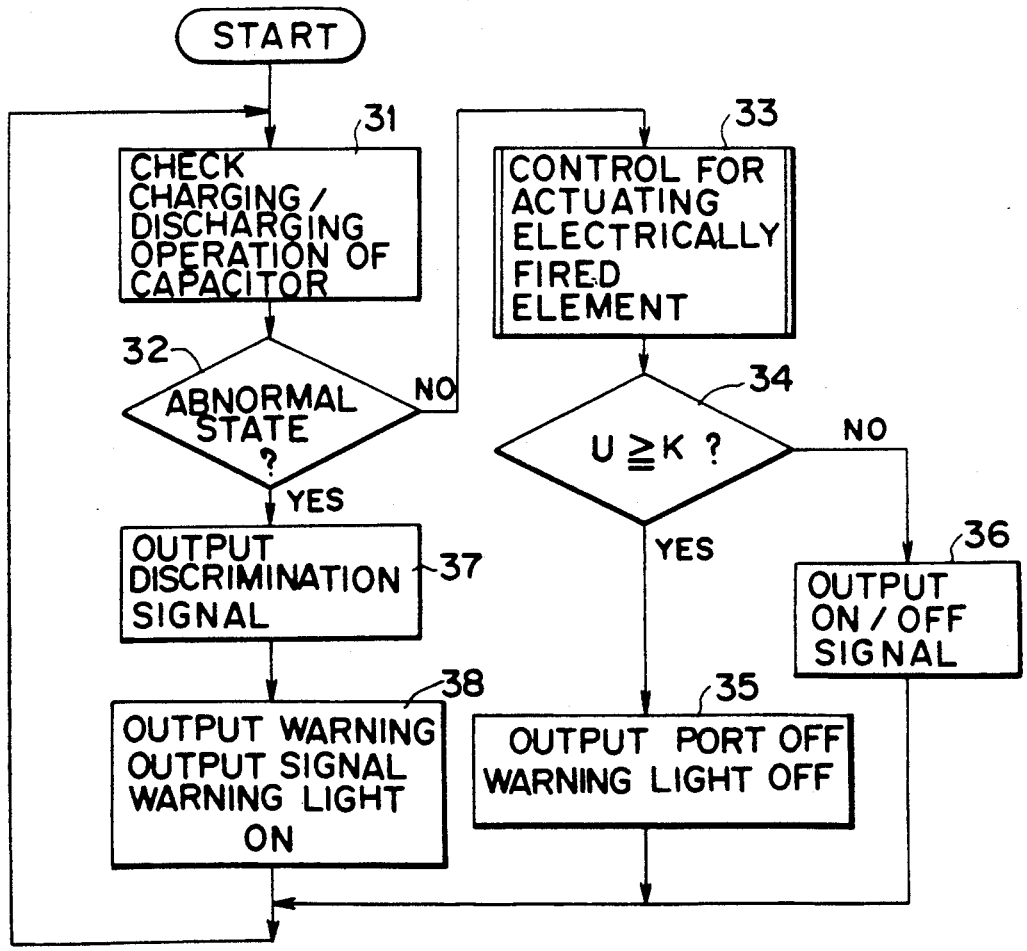

SYSTEM FOR VEHICLE SAFETY DEVICES

BACKGROUND OF THE INVENTION

1. Field of the Invention

The present invention relates to a system for vehicle safety devices such as air-bags, safety belt tightening devices and the like in a motor vehicle.

2. Description of the Prior Art

For ensuring the safety of motor vehicle passengers, there have been developed various vehicle safety devices such as air-bags, safety belt tightening devices and the like.

In a vehicle safety system including such a vehicle safety device, in order to ensure the operation of a safety device assuredly even if the battery is disabled at the time of a vehicle collision, the system is provided with an electric energy supply circuit for storing electric energy for actuating the safety device, which is called an "energy reservoir". The conventional energy reservoir has a voltage step-up circuit including an inductance element and a capacitor of large capacity, and a high output voltage derived from the voltage step-up circuit in response to the application of an ON/OFF signal is supplied to the capacitor to store the electric energy for actuating the safety device therein. Then, the electric energy stored in the capacitor is supplied to the electrically fired actuator of the vehicle safety device at the time of a vehicle collision, so that the vehicle safety device operates reliably.

Consequently, it is necessary for these devices to be constantly monitored to determine whether or not the system is in a ready condition enabling the safety device to operate assuredly upon the occurrence of a vehicle collision, and to inform the driver whenever trouble occurs. To satisfy these requirements, the conventional system has a circuit for monitoring or checking the condition of the various portions of the vehicle safety system, and a warning light mounted on a center console is turned on to inform the driver of the occurrence of trouble when a malfunction arises in the system. For enabling the driver to check whether or not the warning light itself is broken, this warning light is normally turned on only once at the beginning of vehicle operation, at the time the ignition switch is turned on. Accordingly, in the case where the warning light filament or the wire supplying current to the warning light breaks in the course of the vehicle operation, it becomes impossible to inform the driver of the occurrence of any malfunction of the safety system even if the circuit detects that there is a malfunction in the safety system.

SUMMARY OF THE INVENTION

It is an object of the present invention to provide an improved system for vehicle safety devices.

It is another object of the present invention to provide a vehicle safety system, which is capable of assuredly giving the driver a warning whenever malfunction arises in the system.

According to the present invention, in a vehicle safety system having a safety device for protecting a vehicle occupant from a vehicle collision when a vehicle collision has occurred, the system comprises a warning buzzer for producing a warning sound, an energy supply circuit means for supplying electric energy for actuating an electrically fired element of the safety device, and a checking means for checking whether or not there is an abnormal condition in the system. The energy supply circuit means has a voltage step-up circuit means in which an inductance element of the warning buzzer is incorporated so as to act as a coil element for generating a back electomotive force for a voltage step-up in response to an ON/OFF voltage signal. The system further comprises an applying means responsive to the checking means for applying a signal with at least an audible frequency component to the voltage step-up circuit means when an abnormal condition has occurred in the system, whereby the warning buzzer produces a warning sound in accordance with the audible frequency component.

In the case where it is detected by the checking means that there is no malfunction in the system, the frequency of the ON/OFF signal is set higher than the audible frequency range, so that the buzzer does not generate an audible sound while the voltage step-up operation is carried out in the voltage step-up circuit by the application of the ON/OFF signal. In contrast, when the checking means detects a malfunction in the system, a signal having audible frequency components is applied as the ON/OFF signal to the voltage step-up circuit, whereby the buzzer operates to generate the warning sound while the voltage step-up circuit produces the high output voltage.

The invention will be better understood and other objects and advantages thereof will be more apparent from the following detailed description of preferred embodiments with reference to the accompanying drawings.

BRIEF EXPLANATION OF THE DRAWINGS

FIG. 1 is a circuit diagram showing an embodiment of a vehicle safety system according to the present invention;

FIGS. 2A and 2B are waveforms of the first and second signals used in the system of FIG. 1;

FIG. 3 is a circuit diagram showing another embodiment of a vehicle safety system according to the present invention; and FIG. 4 is a flow chart showing a control program executed in the controller of FIG. 3.

DESCRIPTION OF THE PREFERRED EMBODIMENTS

Referring to FIG. 1, a vehicle safety system 1 comprises an acceleration sensor 2 for sensing the acceleration of a vehicle (not shown), which may be the conventional semiconductor type vehicle acceleration sensor of well-known design for detecting the magnitude of the positive/negative change in the speed of a vehicle per unit time as an acceleration. The acceleration sensor 2 is mounted at, for example, an appropriate place in the engine compartment and an output signal KS showing the acceleration acting on the vehicle body is produced thereby.

The output signal KS is applied to a control unit 3 in which it is determined whether or not a collision has occurred on the basis of the output signal KS. The control unit 3 may be a conventional collision discriminating unit wherein the output signal KS is integrated to obtain vehicle speed data and the vehicle speed data is compared with reference data to determine whether or not a collision has occurred.

An output line 3a of the control unit 3 is connected with the base of a driving transistor 6 having an emitter which is grounded through an electrically fired actuator 5 of an air-bag 4. An output voltage Vo appears on the output line 3a when it is detected by the control unit 3 that a collision has occurred, and the driving transistor 6 is fully turned on to allow a firing current to flow from an energy supply circuit 7 connected to the collector circuit of the driving transistor 6 to the electrically fired actuator 5.

The energy supply circuit 7 is a so-called energy reservoir, and has a voltage step-up circuit 10 including a switching transistor 8 and an inductance element 9 connected with a collector circuit of the switching transistor 8 and a capacitor 11 of large capacity which is charged by an output voltage produced from the voltage step-up circuit 10.

In order to selectively supply a first signal $S_1$ generated by a first signal generator 14 or a second signal $S_2$ generated by a second signal generator 15 to the switching transistor 8, the vehicle safety system 1 is provided with a switching circuit 13, which is connected through a base resistor 16 to the base of the switching transistor 8 having an emitter which is grounded. The collector of the switching transistor 8 is connected through the inductance element 9 with a positive terminal of a battery 17 whose negative terminal is grounded. In this case, the inductance element 9 is an exciting coil of a warning buzzer 18 for informing the driver of the presence of any malfunction occurring in the system 1. However, as described later, the inductance element 9 serves to produce a back electromotive force in the cooperation with the switching transistor 8 when an ON/OFF voltage signal with a predetermined frequency is applied to the base of the switching transistor 8, and a high voltage output signal E is produced due to the back electromotive force.

In the embodiment of FIG. 1, the first signal generator 14 generates an ON/OFF voltage signal with a constant frequency higher than the audible frequency range, and the ON/OFF voltage signal is supplied as the first signal $S_1$ through the switching circuit 13 to the switching transistor 8, whereby the high voltage output signal E is produced. As illustrated in FIG. 2A, the first signal $S_1$ is a repeated pulse signal of, for example, 20 (KHz), and the switching transistor 8 is turned on/off in accordance with the level state of the first signal $S_1$ to produce the high voltage output signal E. However, the buzzer 18 does not make a warning sound in response to the application of the first signal $S_1$ because the frequency of the first signal $S_1$ is higher than the audible frequency range.

The high voltage output signal E from the voltage step-up circuit 10 is applied through a diode 19 to the capacitor 11 in order to charge the capacitor 11, whereby electric energy sufficient for firing the electrically fired actuator 5 is always stored in the energy supply circuit 7. As a result, it is possible to provide the required firing current from the capacitor 11 to the electrically fired element 5 when the driving transistor 6 is fully turned on in response to the application of the output voltage Vo from the control unit 3 even if the battery 17 is disabled when a vehicle collision occurs, whereby the air-bag 4 is made to operate assuredly irrespective of the disablement of the battery 17.

In order to check whether or not the energy supply circuit 7 is in a normal operating state, the vehicle safety system 1 comprises a check unit 20 to which the voltage developed across the capacitor 11 is applied. The check unit 20 may be the conventional circuit wherein it is discriminated whether or not the energy supply circuit 7 is in the state of normal operation on the basis of the charging/discharging condition detected at the time the charge stored in the capacitor 11 is discharged by a predetermined load during a prescribed time period.

The check unit 20 is arranged to produce a switch control signal CS for controlling the operation of switching-over of the switching circuit 13 in accordance with the discriminated operation state of the energy supply circuit 7. The level of the switch control signal CS is high when it is determined by the check unit 20 that the energy supply circuit 7 is in a normal condition, causing the switching circuit 13 to assume the state shown by a solid line in FIG. 1. In contrast, the level of the switch control signal CS is low when it is determined by the check unit 20 that the energy supply circuit 7 is in an abnormal condition, causing the switch circuit 13 to assume the state as shown by a broken line in FIG. 1. Reference numeral 21 designates a warning light which is connected with the check circuit 20, and the warning light 21 is turned on when an abnormal state of the energy supply circuit 7 is detected by the check unit 20.

The operation of the system 1 will now be explained. The switch control signal CS with high level is produced by the check unit 20 when the energy supply circuit 7 is in the normal state, so that the first signal $S_1$ is applied through the switching circuit 13 to the switching transistor 8. Accordingly, the voltage step-up operation is carried out by the voltage step-up circuit 10 without the production of a warning sound by the buzzer 18, as explained earlier. If an abnormal state in the energy supply circuit 7 is detected by the check unit 20, the switching circuit 13 is switched over as shown by the broken line to supply the second signal $S_2$, which has an audible frequency component, to the switching transistor 8, in place of the first signal $S_1$. In this embodiment, a repeated pulse signal of audible frequency is employed as the second signal $S_2$ and the frequency of the repeated pulse signal is selected at 2 (KHz), whose waveform is illustrated in FIG. 2B. Thus, it follows that the buzzer 18 operates to produce a warning sound and the warning light 21 is turned on when the second signal $S_2$ is applied to the switching transistor 8 in response to the occurrence of an abnormal state in the energy supplying circuit 7. In this case, of course, the voltage step-up circuit 10 also serves to produce the high voltage output signal E and the capacitor 11 is charged while the warning sound is being produced by the buzzer 18.

With this constitution, the circuitry of the vehicle safety system becomes simple since the coil or inductance element of the buzzer 18 can also be utilized as the inductance element 9 of the voltage step-up circuit 10 of the energy supply circuit 7, whereby the manufacturing cost of the vehicle safety system can be reduced. Furthermore, the warning operation is ensured by the buzzer 18 even if the filament or wire of the warning light 21 should break. In particular, in this embodiment, it follows that the warning light 21 is turned on when the coil of the buzzer 18, that is, the inductance element 9 has broken, whereby the driver can easily ascertain malfunction of the inductance element 9.

The pulse signal of 2 (KHz) shown in the embodiment of FIG. 1 is only one example, and it is alternatively possible to use as the second signal $S_2$ a signal obtained by modulating the first signal $S_1$ of 20 (KHz) with an appropriate audible frequency signal, which is able to operate the buzzer 18 so as to produce the warning sound.

FIG. 3 is a circuit diagram showing a vehicle safety system 1' according to another embodiment of the present invention, which is provided with a controller 30 including a conventional microcomputer in which a control program is executed to realize functions corresponding to those of the control unit 3, the check unit 20, the first signal generator 14, the second signal generator 15 and the switching circuit 13 of the first embodiment. In FIG. 3, the portions corresponding to the portions of FIG. 1 are designated by the identical references and no description will be given thereto.

Description is now given to the control program with reference to the flow chart of FIG. 4.

After the start of the execution of the control program, the operation moves to step 31 wherein the charging/discharging condition of the capacitor 11 of the energy supply circuit 7 is checked and discrimination is made in step 32 as to whether or not the energy supplying circuit 7 is in an abnormal condition.

The determination in step 32 is NO when there is no abnormal condition in the energy supply circuit 7, and the operation moves to step 33 wherein the control operation for firing the electrically fired actuator 5 is carried out. The processing operation executed in step 33 corresponds to that carried out by the control unit 3 of FIG. 1. The output voltage Vo is produced to turn on the driving transistor 6 when it is determined that a vehicle collision has occurred. However, the output voltage Vo is not produced in any case other than when it is not determined that a vehicle collision has occurred.

Then, the operation moves to step 34 wherein discrimination is made as to whether or not the value U of the terminal voltage of the capacitor 11, which is applied to the controller 30, is greater than a predetermined value K. The determination in step 34 is YES when U≧K, and the operation moves to step 35 wherein the output port 30a of the controller 30 is cut off to stop the production of the signal for causing the high output voltage to be produced, which corresponds to the first signal S₁ of FIG. 1, and the warning light 21 is turned off. Then, the operation returns to step 31. The determination in step 34 is NO when U≧K, and the operation moves to step 36 wherein a signal used for causing a high voltage output signal to be produced by the voltage step-up circuit 10 is produced as an ON/OFF signal from the output port 30a, and the capacitor 11 is charged. The frequency of the signal produced from the output port 30a is higher than the audible frequency range at this time, so that the buzzer 18 does not operate to produce the warning sound. After the execution of step 36, the program is returned to step 31.

The determination is YES in step 32 when it is detected that the energy supply circuit 7 is in an abnormal condition, and the operation moves to step 37 wherein a discrimination signal indicative of the nature of the detected abnormality is produced. The discrimination signal is an audible frequency signal and has a waveform or time interval corresponding to the nature of the malfunction detected at that time. The operation next moves to step 38, wherein a pulse signal, whose frequency is higher than the audible frequency range, is modulated with the discriminating signal and the resulting signal is output as a warning output signal from the port 30a. At the same time the warning light 21 is turned on.

Accordingly, the buzzer 18 operates to produce the warning sound in response to the warning output signal when an abnormal condition has occurred in the energy supply circuit 7, and the driver can discriminate the nature of the abnormal state on the basis of the pattern or tone of the warning sound.

I claim:

1. A vehicle safety system having a safety device for protecting a vehicle occupant from a vehicle collision, said safety device being rendered operative when a vehicle collision has occurred, said system comprising:
   a warning buzzer for producing a warning sound;
   an energy supply circuit means for supplying electric energy for actuating an electrically fired element of the safety device, said energy supply circuit means having a voltage step-up circuit means in which an inductance element of said warning buzzer is incorporated so as to act as a coil element for generating a back electromotive force for a voltage step-up in response to an ON/OFF voltage signal;
   a checking means for checking whether or not there is an abnormal condition in said system; and
   an applying means responsive to said checking means for applying a signal with at least an audible frequency component to said voltage step-up circuit means when an abnormal condition has occurred in said system, whereby said warning buzzer produces a warning sound in accordance with the audible frequency component.

2. A system as claimed in claim 1, wherein said energy supply circuit means further comprises a capacitor of large capacity which is charged by a high output voltage signal produced in response to the ON/OFF voltage signal by said voltage step-up circuit means, and the electric energy can be supplied from the capacitor to the electrically fired element at the time of a vehicle collision.

3. A system as claimed in claim 1, wherein said checking means is for checking whether or not charging/discharging characteristics of the capacitor are abnormal.

4. A system as claimed in claim 1, wherein said applying means has means for generating a pulse signal including an audible frequency signal component, and means for applying the pulse signal as the ON/OFF voltage signal to said voltage step up circuit means when an abnormal condition has occurred in the system.

5. A system as claimed in claim 1, wherein said applying means has means for generating a pulse signal whose frequency is within the audible frequency range, and means for applying the pulse signal as the ON/OFF voltage signal to said voltage step-up circuit means when an abnormal condition has occurred in the system.

6. A system as claimed in claim 1, wherein said system further comprises a warning light which is turned on when the occurrence of an abnormal condition is detected by said checking means.

7. A vehicle safety system for protecting a vehicle occupant from a vehicle collision when a vehicle collision has occurred, said system comprising:
   a safety device for protecting a vehicle occupant from a shock produced by a vehicle collision, said safety device having an electrically fired element;
   a warning buzzer for producing a warning sound;
   a first generating means for generating a first signal which is an ON/OFF signal with a frequency higher than the audible frequency range;

an energy supply circuit means for supplying electric energy necessary for actuating the electrically fired element, said energy supply circuit means having a voltage step-up circuit means in which an inductance element of said warning buzzer is incorporated so as to act as a coil element for generating a back electromotive force for a voltage step-up in response to the first signal;

a controlling means for supplying the electric energy to the electrically fired element when a vehicle collision has occurred;

a checking means for checking whether or not there is an abnormal condition in said system; and an applying means responsive to said checking means for applying a signal with at least an audible frequency component to said voltage step-up circuit means when an abnormal condition has occurred in said system, whereby said warning buzzer produces a warning sound in accordance with the audible frequency component.

8. A system as claimed in claim 7, wherein said controlling means has a current control means for controlling a current flowing from said energy supply circuit means to the electrically fired element, and means for controlling said current control means so as to allow the electric energy to be supplied to the electrically fired element when a vehicle collision has occurred.

9. A system as claimed in claim 7, wherein said applying means has a second generating means for generating a second signal which is an ON/OFF signal with at least an audible frequency component, and means responsive to said checking means for supplying the second signal to said voltage step-up circuit means in place of the first signal.

* * * * *